(12) United States Patent
Kirmser et al.

(10) Patent No.: US 7,945,406 B2
(45) Date of Patent: May 17, 2011

(54) MEASURING DEVICE AND METHOD FOR MEASURING RELATIVE PHASE SHIFTS OF DIGITAL SIGNALS

(75) Inventors: Stephane Kirmser, Munich (DE); Heinz Mattes, Munich (DE); Sebastian Sattler, Munich (DE)

(73) Assignee: Infineon Technologies AG, Munich (DE)

( * ) Notice: Subject to any disclaimer, the term of this patent is extended or adjusted under 35 U.S.C. 154(b) by 1286 days.

(21) Appl. No.: 11/530,257

(22) Filed: Sep. 8, 2006

(65) Prior Publication Data
US 2007/0226602 A1    Sep. 27, 2007

(30) Foreign Application Priority Data

Sep. 9, 2005   (DE) .................. 10 2005 043 208
Sep. 15, 2005  (DE) .................. 10 2005 044 194

(51) Int. Cl.
*G01R 25/00*    (2006.01)
*G01R 29/26*    (2006.01)

(52) U.S. Cl. .................... 702/72; 324/76.77

(58) Field of Classification Search .......... 702/66, 702/70–74, 79, 117, 124–125; 324/537, 324/763–765, 76.12–76.13, 76.77
See application file for complete search history.

(56) References Cited

U.S. PATENT DOCUMENTS

| | | | | |
|---|---|---|---|---|
| 5,535,252 A | * | 7/1996 | Kobayashi | 375/371 |
| 5,874,725 A | * | 2/1999 | Yamaguchi | 235/492 |
| 6,028,503 A | * | 2/2000 | Preishuberpflugl et al. | 340/10.4 |
| 7,046,298 B2 | * | 5/2006 | Kuzumoto et al. | 348/465 |
| 7,149,269 B2 | * | 12/2006 | Cranford et al. | 375/373 |

FOREIGN PATENT DOCUMENTS

DE    19630917    3/1998

OTHER PUBLICATIONS

Mattes, H., et al., "Next Generation ADC Massive Parallel Testing with Real Time Parameter Evaluation", pp. 1-14, date unknown.

* cited by examiner

*Primary Examiner* — Andrew Schechter
*Assistant Examiner* — Mary C O'Malley
(74) *Attorney, Agent, or Firm* — Banner & Witcoff, Ltd.

(57) ABSTRACT

M periods of the test signal and of the reference signal are received. The periods of the test signal and of the reference signal are in each case $T_{sig}$ long. The test signal is sampled with N sampled values at a sampling frequency $f_s=1/T_s$. Also, $N*T_s=M*T_{sig}$, where N>M. The sampled values are numbered progressively by n, for which $0 \leq n \leq N-1$. The sampled values have a defined relative phase shift with respect to the reference signal. The phase shift $T_\phi$ is calculated by $$\sum_{i=0}^{M-1} Idx(i) + K,$$

K being a constant and Idx(i) corresponding to the number n which is either the first sampled value after a test signal zero crossing during the reference signal's $i^{th}$ period or the last sampled value before a test signal zero crossing during the reference signal's $i^{th}$ period. Either only rising or only falling zero crossings are taken into account.

25 Claims, 4 Drawing Sheets

MEASURING DEVICE AND METHOD FOR MEASURING RELATIVE PHASE SHIFTS OF DIGITAL SIGNALS

PRIORITY

This application claims priority from German Patent Application No. DE 10 2005 043 208.5, which was filed on Sep. 9, 2005, and German Patent Application No. DE 10 2005 044 194.7, which was filed on Sep. 15, 2005, and are incorporated herein by reference in their entirety.

TECHNICAL FIELD

The invention relates to a measuring device and method for measuring relative phase shifts of digital signals.

BACKGROUND

During digital real-time signal analysis in the time domain it is important to know the phase shift of the signal to be tested with respect to the reference signal. Deviations in the phase shift between these two signals lead to reduced accuracy in the determination of the signal parameters.

The relative phase shift of signals is the phase difference, that is to say the time displacement, of the signals in relation to one another. From Tietze U., Schenk Ch. "Halbleiter-Schaltungstechnik" [Semiconductor Circuit Engineering], 10th edition, p. 956, it is known to detect the phase by means of a sample and hold element, by the voltage of a signal at the time of the zero crossing of a reference signal being switched to a capacitor and the voltage on the capacitor indicating a measure of the phase.

A measurement of the relative phase shift of digital signals by using a capacitor, which represents a delay element, would slow the measurement at high frequencies, for example in the range from 1 MHz to 10 MHz, and the measurement would not be able to be performed in real time. In addition, during the measurement of relative phase shifts of digital signals with such high frequencies, a high sampling rate and, at the same time, a good resolution are required. At a signal frequency of 10 MHz and a required 1000 sampled values per period, the sampling frequency would have to be 1000*10 MHz=10 GHz. Such a high sampling frequency cannot be implemented in many applications.

SUMMARY

In a measuring device and in a method with which the relative phase shift between two digital signals is measured in real time, even if the signals exhibit high frequencies, firstly M periods of the test signal and M periods of the reference signal are received. The period length of the test signal and the period length of the reference signal are respectively $T_{sig}$, and M is a natural number greater than 1. The test signal is not present as a continuous function but as a sequence of equidistant sampled values. In order to achieve a predefined accuracy of the analysis, a minimum number of the sampled values per test signal period may be required.

The test signal can be sampled with N sampled values. The sampled values can be synchronized with the reference signal, that is to say they have a defined relative phase shift in relation to the reference signal. The time interval of the sampled values is given by the sampling frequency $f_s$, which is equal to $1/T_s$. The number of sampled values N can be chosen such that $N*T_s = M*T_{sig}$. Here, N is a natural number greater than M. The sampled values can be numbered by means of the value n. n can be incremented by 1 in each case in the range $0 \leq n \leq N-1$, beginning at zero.

The relative phase shift $T_\phi$ between the test signal and the reference signal can be calculated by means of the term $$\sum_{i=0}^{M-1} Idk(i) + K.$$

Here, K is a constant and Idx(i) is the number n of that sampled value which is the first sampled value after the zero crossing of the test signal in the $i^{th}$ period of the reference signal. The periods can be incremented from 0 up to and including M−1. During the zero crossings, either only the rising or only the falling zero crossings can be taken into account. Rising zero crossings will also be designated positive zero crossings and falling zero crossings will also be designated negative zero crossings in the following text.

BRIEF DESCRIPTION OF THE DRAWINGS

The invention is illustrated in more detail in the drawings, using an exemplary embodiment.

DETAILED DESCRIPTION

Figure 1:
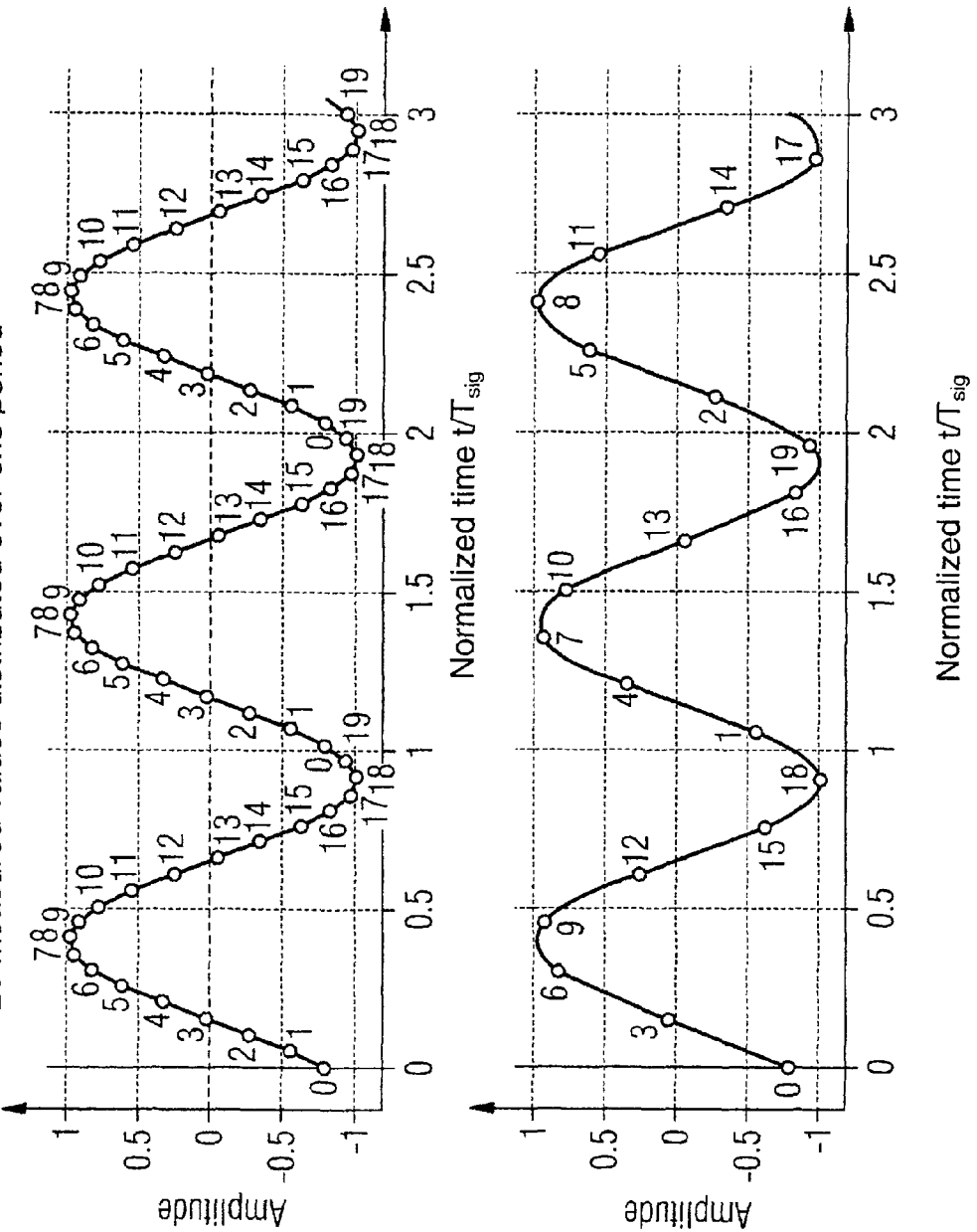
FIG. 1 shows the distribution of the sampled values over M periods of a test signal.

The N sampled values are distributed over the number of periods of the test signal received. It can be therefore advantageously possible to operate with a low sampling frequency and nevertheless to achieve the required time resolution. For instance, if a sampling circuit is available which is capable of sampling a signal at a maximum of 350 MHz, then N=1000 sampled values can be distributed over at least 10 GHz/350 MHz=28.57 periods. The number of periods M must be integral. Therefore, M=29 would be chosen in this example. The N sampled values of the sinusoidal test signal are distributed over M periods so that, for one data set, M measurements are available, from whose average the phase shift is determined. As a result, the susceptibility to noise can be reduced sharply. By means of a suitable choice of M, signals with any desired high virtual sampling rate can be processed.

In this case, the term $$\sum_{i=0}^{M-1} Idk(i) + K$$

indicates the computational rule, using which the relative phase shift between the test signal and the reference signal can be determined. In order to distribute the sampled values to a plurality of periods, it is necessary for the test signal and the reference signal to be periodic. The use of a low-frequency sampling rate permits the use of simple and therefore also inexpensive measuring devices, for example for the generation of the sampling frequency. If no devices for sampling with a very high sampling frequency are available, the measurement of the phase shift of test signals with high frequencies is made possible only by the distribution of the sampled values to a plurality of periods.

The number of sampled values n can be incremented from 0 up to and including N−1, which means that frequent resetting of a counter needed for the incrementing is avoided. The synchronization of the sampling with the reference signal is complicated and should therefore be carried out only as often as necessary.

The values Idx(i) can be read during the M periods of the test signal and are therefore available in real time.

The real sampling rate for this configuration is still only $f_s = f_{sig} * N/M = 344.828$ MHz. Here, $f_{sig} = 1/T_{sig}$. If the sampled values lying on M=29 periods are re-sorted to a single period, a virtual sampling frequency of $f_s = N * f_{sig} = 10$ GHz is obtained.

The number of sampled values N and the number of received periods M are preferably relatively prime, that is to say are coprime.

If, on the other hand, M and N have a common divisor, then some of the samples are simply repetitions of other sampled values. For instance, if M=2 and N=12, then 256 values of the test signal are sampled twice successively. In this case, although the second set of 256 samples samples the second period, it is given the same values as during the sampling of the first period. The second set of samples consequently provides no gain in information. Such unnecessary samples are avoided by the provision of coprime values M and N.

In one embodiment, the constant K is calculated by means of the term (NM)−N+M. Thus, K can be calculated independently of the periods $T_{sig}$ and $T_s$. The relative phase shift $T_\phi$ is preferably calculated by means of one of the formulas $$\frac{T_\Phi}{T_{sig}} = \frac{1}{N}\left(\sum_{i=0}^{M-1} Idx(i_+) - \frac{NM-N+M}{2} \pm \frac{1}{2}\right),$$

$$\frac{T_\Phi}{T_{sig}} = \frac{1}{N}\left(\sum_{i=0}^{M-1} \left(Idx(i_+) - \frac{N}{2}\right) + \frac{N-M}{2} \pm \frac{1}{2}\right)$$

$$\frac{T_\Phi}{T_s} = \frac{1}{M}\left(\sum_{i=0}^{M-1} Idx(i_+) - \frac{NM-N+M}{2} \pm \frac{1}{2}\right),$$

$$\frac{T_\Phi}{T_s} = \frac{1}{M}\left(\sum_{i=0}^{M-1} \left(Idx(i_+) - \frac{N}{2}\right) + \frac{N-M}{2} \pm \frac{1}{2}\right)$$

$$\frac{T_\Phi}{T_{vs}} = \left(\sum_{i=0}^{M-1} Idx(i_+) - \frac{NM-N+M}{2} \pm \frac{1}{2}\right) \text{ or}$$

$$\frac{T_\Phi}{T_{vs}} = \left(\sum_{i=0}^{M-1} \left(Idx(i_+) - \frac{N}{2}\right) + \frac{N-M}{2} \pm \frac{1}{2}\right)$$

Idx($i_+$) designates the numbers of the sampling points immediately after the zero crossing of the rising flank. The formulas in each case specify the upper and the lower limit of a range in which the value for the normalized phase shift is located.

The formulas are derived in that, firstly, a periodic continuous test signal having M periods is considered. Let the time displacement of the test signal with respect to a reference signal be $T_\phi$. The time interval between two positive zero crossings of the test signal is equal to the period $T_{sig}$. The times at which the rising test signal intersects the zero line are designated $T_{0i}$. If the M times are added to the positive zero crossings $T_{0i}$, the result is $$\sum_{i=0}^{M-1} T_{0i} = \sum_{i=0}^{M-1} (T_\Phi + iT_{sig}) \quad (2.1)$$

$$= MT_\Phi + T_{sig}\sum_{i=0}^{M-1} i = MT_\Phi + T_{sig}\frac{1}{2}M(M-1)$$

If (2.1) is rearranged for $T_\varphi$, the result is:

$$T_\Phi = \frac{1}{M}\sum_{i=0}^{M-1} T_{0i} - T_{sig}\frac{M-1}{2}. \quad (2.2)$$

For phase compensation, it can be beneficial to relate the time displacement $T_\phi$ to the sampling time $T_s = 1/f_s$, which specifies the time interval between two sample values.

$$\frac{T_\Phi}{T_s} = \frac{1}{M}\sum_{i=0}^{M-1} \frac{T_{0i}}{T_s} - \frac{T_{sig}}{T_s}\frac{M-1}{2} \quad (2.3)$$

The sampling time and the period of the test signal are linked with one another via the ratio between the number of sampled values N and the number of periods M.

$$NT_s = MT_{sig} \rightarrow \frac{T_{sig}}{T_s} = \frac{N}{M} \quad (2.4)$$

If the ratio from (2.4) is inserted into (2.3), then the final result is $$\frac{T_\Phi}{T_s} = \frac{1}{M}\sum_{i=0}^{M-1} \frac{T_{0i}}{T_s} - \frac{N}{M}\frac{M-1}{2} \quad (2.5)$$

By using the shortened form $$Idx(i) = \frac{T_{0i}}{T_s} \quad (2.6)$$

the following is obtained:

$$\frac{T_\Phi}{T_s} = \frac{1}{M}\sum_{i=0}^{M-1} Idx(i) - \frac{N}{M}\frac{M-1}{2} = \frac{1}{M}\left(\sum_{i=0}^{M-1} \left(Idx(i) - \frac{N}{2}\right) + \frac{N}{2}\right). \quad (2.7)$$

If the phase shift is normalized to the signal frequency $T_{sig}$, the formula results as:

$$\frac{T_\Phi}{T_{sig}} = \frac{1}{N}\sum_{i=0}^{M-1} Idx(i) - \frac{M-1}{2} \quad (2.8)$$

$$= \frac{1}{N}\left(\sum_{i=0}^{M-1} \left(Idx(i) - \frac{N}{2}\right) + \frac{N}{2}\right)$$

The accuracy of the method can be determined by means of the determination of the error. If the first zero crossing of the rising flank is located exactly at an integer multiple of the sampling time, then for this time period it is true that:

$$T_{00} = kT_s, k \in \mathbb{N} \quad (3.1)$$

However, if the zero crossing is located between two sampled values, then a positive value less than 1 still has to be taken into account.

$$T_{00} = (k+\alpha)T_s = \alpha \cdot T_s + kT_s, 0 < \alpha < 1 \quad (3.2)$$

The second zero crossing takes place one period later.

$$T_{01} = \alpha \cdot T_s + kT_s + T_{sig} \quad (3.3)$$
$$= \alpha \cdot T_s + kT_s + \frac{T_{sig}}{T_s} T_s$$
$$= \alpha \cdot T_s + kT_s + \frac{N}{M} T_s$$

For the $i^{th}$ zero crossing it is then true that:

$$T_{0i} = \alpha \cdot T_s + kT_s + \frac{iN}{M} T_s \quad (3.4)$$

When summing the times, only the indices of the sampled values are added. This means that only integer multiples of the sampling time $T_s$ are taken into account $$\sum_{i=0}^{M-1} \frac{T_{0i}}{T_s} = \sum_{i=0}^{M-1} \left( k + Int\left( \alpha + \frac{iN}{M} \right) \right) + \varepsilon \quad (3.5)$$
$$= \sum_{i=0}^{M-1} Idx(i) + \varepsilon$$

The operator Int(X) supplies the integer component of the floating-point number X. The unconsidered sum of the remainders leads to an error $\varepsilon$. The remainders are formed by the modulo operator.

$$\varepsilon = \sum_{i=0}^{M-1} \frac{\mathrm{mod}(M\alpha + iN, M)}{M} \quad (3.6)$$

Since N and M are coprime, their ratio is not an integer. N may be broken down into the sum of a multiple of M and a remainder.

$$iN = \alpha_{iM} + b_i \quad (3.7)$$
$$\mathrm{mod}(iN, M) = b_i \quad (3.8)$$

Since M and N are relatively prime, the coefficients $b_i$ run through all values from 0 to M−1.

The expression M α, can also be broken down into an integer and a fractional component.

$$M\alpha = cM + \beta \text{ with } 0 \leq \beta < 1 \quad (3.9)$$

From the relationship $\beta < 1$ it follows that the sum of $\beta$ and $b_i$ is smaller than M for all i.

$$b_i + \beta < M \; \forall i \text{ with } 0 \leq i < M-1 \quad (3.10)$$

and thus $$\mathrm{mod}(M\alpha + iN, M) = \mathrm{mod}(M\alpha, M) + \mathrm{mod}(iN, M) = \beta b_i \quad (3.11)$$

This means that a displacement of the test signal by $\alpha$ does not manifest itself in the integer sum of the zero crossings. For the sum of the remainders, the following is thus obtained:

$$\varepsilon = \sum_{i=0}^{M-1} \frac{\beta + b_i}{M} \quad (3.12)$$
$$= \sum_{i=0}^{M-1} \frac{\beta + i}{M}$$
$$= \beta + \frac{1}{M} \frac{1}{2} M(M-1)$$
$$\varepsilon = \beta + \frac{M-1}{2} \quad (3.13)$$

When forming the integer values, there is the possibility of using the points immediately before the zero crossings or the points immediately after the zero crossings.

When the sampled values before the zero crossing are chosen, the integer is formed by rounding down. This is achieved by means of the floor() operator, which always rounds to the next smaller whole number. In this case, the sum over the integer indices is too small. The result still has to be corrected upward by the components of the remainders. For the $i^{th}$ zero crossing it is then true that:

$$\frac{T_{0i}}{T_s} = k + \mathrm{floor}\left( \alpha + \frac{iN}{M} \right) + \frac{\mathrm{mod}(M\alpha + iN, M)}{M} \quad (3.14)$$
$$= Idx(i_-) + \frac{\mathrm{mod}(M\alpha + iN, M)}{M}$$

Idx($i_-$) designates the indices of the sampling points immediately before the zero crossing of the rising flank. The following is therefore obtained for the sum of the zero crossings:

$$\sum_{i=0}^{M-1} \frac{T_{0i}}{T_s} = \sum_{i=0}^{M-1} \left( Idx(i_-) + \frac{\mathrm{mod}(M\alpha + iN, M)}{M} \right) \quad (3.15)$$
$$= \sum_{i=0}^{M-1} Idx(i_-) + \beta + \frac{M-1}{2}$$

If this relationship is taken into account in (2.7), the following is obtained:

$$\frac{T_\Phi}{T_s} = \frac{1}{M} \left( \sum_{i=0}^{M-1} \left( Idx(i_-) - \frac{N}{2} \right) + \frac{N}{2} + \beta + \frac{M-1}{2} \right) \quad (3.16)$$

When the sampled values before the zero crossing are chosen, the integer is formed by rounding up. This is achieved by means of the ceil() operator, which always rounds up to the next larger number. In this case, the sum over the integer indices is too large. The result still has to be corrected downward by the components of the fractional terms. For the $i^{th}$ zero crossing it is then true that:

$$\frac{T_\Phi}{T_s} = k + \mathrm{ceil}\left( \alpha + \frac{iN}{M} \right) - \left( 1 - \frac{\mathrm{mod}(M\alpha + iN, M)}{M} \right) \quad (3.17)$$

-continued $$= Idx(i_+) - \left(1 - \frac{\text{mod}(M\alpha + iN, M)}{M}\right)$$

The following is therefore obtained for the sum of the zero crossings:

$$\sum_{i=0}^{M-1} \frac{T_{0i}}{T_s} = \sum_{i=0}^{M-1} \left(Idx(i_+) - \left(1 - \frac{\text{mod}(M\alpha + iN, M)}{M}\right)\right) \quad (3.18)$$

$$= \sum_{i=0}^{M-1} Idx(i_+) - \left(M - \left(\beta + \frac{M-1}{2}\right)\right)$$

$$= \sum_{i=0}^{M-1} Idx(i_+) + \left(\beta - \frac{M+1}{2}\right)$$

If this is taken into account in (2.7), the following is obtained:

$$\frac{T_\Phi}{T_s} = \frac{1}{M}\left(\sum_{i=0}^{M-1}\left(Idx(i_+) - \frac{N}{2}\right) + \frac{N}{2} + \beta - \frac{M+1}{2}\right) \quad (3.19)$$

The total error is composed of the influence of the fractional terms and the phase shift between two sampling points. The first can be determined exactly, while the second can be specified only within a fixed range. Both in (3.16) and in (3.19), the correction factor $\beta - \frac{1}{2}$ occurs. Since $\beta$ lies between 0 and 1, this expression can be specified as a variable error $|\pm\beta/2| \leq |\pm\frac{1}{2}|$.

$$\frac{T_\Phi}{T_s} = \frac{1}{M}\left(\sum_{i=0}^{M-1}\left(Idx(i_-) - \frac{N}{2}\right) + \frac{N+M}{2} \pm \frac{1}{2}\right) \quad (3.20)$$

$$\frac{T_\Phi}{T_s} = \frac{1}{M}\left(\sum_{i=0}^{M-1}\left(Idx(i_+) - \frac{M}{2}\right) + \frac{N-M}{2} \pm \frac{1}{2}\right) \quad (3.21)$$

Further evaluation formulas for the indices of the sampling points immediately after the zero crossing of the rising flank result from transforming equation (3.21).

In the case of normalizing to the signal period $T_{sig}$, the result is:

$$\frac{T_\Phi}{T_{sig}} = \frac{1}{N}\left(\sum_{i=0}^{M-1} Idx(i_+) - \frac{NM - N + M}{2} \pm \frac{1}{2}\right) \quad (4.1)$$

$$\frac{T_\Phi}{T_{sig}} = \frac{1}{N}\left(\sum_{i=0}^{M-1}\left(Idx(i_+) - \frac{N}{2}\right) + \frac{N-M}{2} \pm \frac{1}{2}\right) \quad (4.2)$$

On the other hand, in the case of normalizing to the sampling time $$T_s = \frac{M}{N}T_{sig},$$

the result is:

$$\frac{T_\Phi}{T_s} = \frac{1}{M}\left(\sum_{i=0}^{M-1} Idx(i_+) - \frac{NM - N + M}{2} \pm \frac{1}{2}\right) \quad (4.3)$$

$$\frac{T_\Phi}{T_s} = \frac{1}{M}\left(\sum_{i=0}^{M-1}\left(Idx(i_+) - \frac{N}{2}\right) + \frac{N-M}{2} \pm \frac{1}{2}\right) \quad (4.4)$$

Normalizing to the virtual sampling time $$T_{vs} = \frac{1}{M}T_s = \frac{1}{N}T_{sig}$$

gives:

$$\frac{T_\Phi}{T_{vs}} = \left(\sum_{i=0}^{M-1} Idx(i_+) - \frac{NM - N + M}{2} \pm \frac{1}{2}\right) \quad (4.5)$$

$$\frac{T_\Phi}{T_{vs}} = \left(\sum_{i=0}^{M-1}\left(Idx(i_+) - \frac{N}{2}\right) + \frac{N-M}{2} \pm \frac{1}{2}\right) \quad (4.6)$$

For the measurement error F, based on the signal frequency $f_{sig}$, $$F| \leq \frac{1}{2N}$$

is consequently true. The result is therefore available with a defined accuracy. The accuracy can be increased by increasing the sampled values N.

The value n at the time of the zero crossing of the reference signal in that period in which i=0 is preferably set to zero and is thus synchronized. This simplifies the calculation, since Idx(i) is thus in each case based on the zero crossing of the reference signal and, during the calculation of the relative phase shift, the phase difference between the zero crossings of the test signal and the zero crossing of the reference signal is calculated directly. The method is particularly suitable in the case of sinusoidal test signals and sinusoidal reference signals. In these, the zero crossing is particularly well suited for the measurement, while minima and maxima are difficult to detect. At the maximum and at the minimum, the derivative is 0, and thus the sensitivity is low. Measuring the maximum and the minimum would therefore be very susceptible to noise.

The invention also relates to a measuring device for measuring the relative phase shift between a periodic digital test signal and a periodic digital reference signal. The measuring device contains an input connection for receiving a test signal and an input connection for receiving a reference signal.

Furthermore, a sampling unit is provided, which samples M periods of the test signal. To this end, use is made of N sampled values having a sampling frequency $f_s=1/T_s$. The sampled values are synchronized in time with the reference signal, that is to say they have a fixed phase relationship relative to the reference signal.

In this case, it is true of the ratio of N and M that $N*T_s=M*T_{sig}$. $T_{sig}$ is equal to the period of the test signal and equal to the period of the reference signal. M is a natural number greater than 1, and N is a natural number greater than M. The sampling unit has a counter which counts the number n of the sampled values progressively from 0 to N−1 and of which the counter reading indicates the number n of sampled values. Here, $0 \leq n \leq N-1$. The N sampled values are thus distributed over a plurality of periods of the test signal. As a result, it is advantageously possible to sample with a low sampling frequency $f_s$, which makes the measuring method simpler and thus less expensive.

The testing device also has a calculation unit, which calculates the phase shift $T_\phi$ between the test signal and the reference signal by using the term $$\sum_{i=0}^{M-1} Idx(i) + K.$$

K is a constant and Idx(i) corresponds either to the counter reading at the time of the first sampled value after a zero crossing of the test signal during the $i^{th}$ period of the reference signal or the counter reading at the time of the last sampled value before a zero crossing of the test signal during the $i^{th}$ period of the reference signal. In this case, either only rising or only falling zero crossings are taken into account.

The measuring device is able to determine the relative phase shift with a simple computational rule. In this case, the counter is reset to zero again only after the value N−1 has been reached, since resetting is complicated.

M and N preferably are coprime, in order to avoid simple repetitions of samples.

In one embodiment of the measuring device, K is determined by means of the term (N*M)−N+M, by which means K is determined independently of $T_{sig}$ and $T_s$. $T_{sig}$ and $T_s$ are generally not integers and are therefore not very suitable for further digital processing. $T_\phi$ can also be calculated by means of one of the formulas $$\frac{T_\phi}{T_{sig}} = \frac{1}{N}\left(\sum_{i=0}^{M-1} Idx(i_+) - \frac{NM - N + M}{2} \pm \frac{1}{2}\right),$$

$$\frac{T_\phi}{T_{sig}} = \frac{1}{N}\left(\sum_{i=0}^{M-1}\left(Idx(i_+) - \frac{N}{2}\right) + \frac{N - M}{2} \pm \frac{1}{2}\right)$$

$$\frac{T_\phi}{T_s} = \frac{1}{M}\left(\sum_{i=0}^{M-1} Idx(i_+) - \frac{NM - N + M}{2} \pm \frac{1}{2}\right),$$

$$\frac{T_\phi}{T_s} = \frac{1}{M}\left(\sum_{i=0}^{M-1}\left(Idx(i_+) - \frac{N}{2}\right) + \frac{N - M}{2} \pm \frac{1}{2}\right)$$

$$\frac{T_\phi}{T_{vs}} = \left(\sum_{i=0}^{M-1} Idx(i_+) - \frac{NM - N + M}{2} \pm \frac{1}{2}\right),$$

$$\frac{T_\phi}{T_{vs}} = \left(\sum_{i=0}^{M-1}\left(Idx(i_+) - \frac{N}{2}\right) + \frac{N - M}{2} \pm \frac{1}{2}\right)$$

where $T_{vs} = T_s/M$ and $Idx(i_+)$ is the number n of that sampled value which is the first sampled value after a positive zero crossing of the test signal during the $i^{th}$ period of the reference signal. It is also possible to calculate the relative phase shift by means of a transformation of one of the above formulas, for example by the negative zero crossings being used as reference points.

The measurement error is noted during the measurement by means of the method according to the invention and, during the measurement of the value, is $$\frac{T_\phi}{T_{sig}}:|F| \leq \frac{1}{2N}.$$

The counter reading of the counter at the time of the zero crossing of the reference signal in the first period, which is defined by i=0, is preferably set to zero. As a result, the value for the relative phase shift, based on the zero crossings of the test signal and of the reference signal, can be determined directly from one of the abovementioned formulas.

The measuring device is particularly well suited as part of a BIST (built in self test), since it can be implemented by a simple and thus space-saving hardware implementation. The measuring device can be constructed as part of a phase correction circuit, which permits high resolution even at high test frequencies.

FIG. 1 shows, in two graphs, test signals with sampled values. In both graphs, in each case the amplitude of the test signal for three periods is plotted against a normalized time. The time in this case is based on the period of the test signal $T_{sig}$. The amplitude of the sinusoidal test signal has values in the range [−1; +1]. The periods are identified by means of the value i, which numbers the periods from 0 to 2.

For each period, the test signal is sampled 20 times in the upper graph. The sampled values are in each case identified by the circles with associated numbers 0 to 19. The sampling frequency $f_s$ is $20/T_{sig}$.

In the lower graph, the same test signal is shown as in the upper graph. However, the graphs differ with regard to the sampling. As compared with the upper graph, sampling points have been removed, so that there are now only N=20 sampling points, which are distributed over the M=3 periods. The number of sampled values is designated N, and the number of sampled periods is M. The sampling frequency $f_s$ is thus $20/(3*T_{sig})$. In the upper graph, the sampled values are repeated from period to period. In the lower graph, the 20 sampled values are all different, since the number of sampled values N and the number of periods M are prime in relation to each other.

Figure 2:
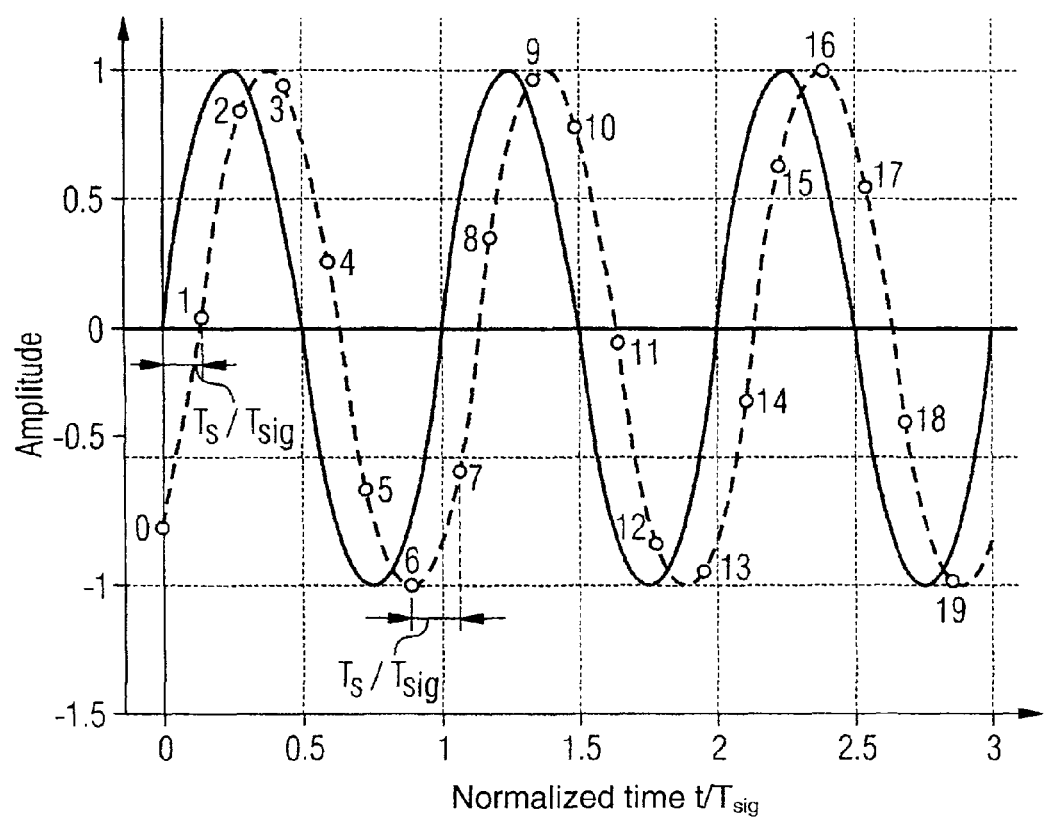
FIG. 2 shows a sinusoidal test signal and a sinusoidal reference signal, which are connected to the inputs of a measuring circuit.

FIG. 2 shows a test signal and a reference signal, as applied to a testing device according to the invention. The reference signal is represented by means of the continuous curve, while the test signal is depicted by means of the dashed curve. The amplitude of the reference signal and the amplitude of the test signal are plotted against the time $t/T_{sig}$ normalized with respect to the period of the test signal $T_{sig}$.

The test signal is sampled with 20 sampled values. The sampled values are identified progressively with 0 to 19, the sampled value 0 being read at the time of the zero crossing of the reference signal. Two sampled values following each other have a time interval of $T_s/T_{sig}$. The reference signal has a positive zero crossing at $t/T_{sig} = 0$. In the present example, the test signal is displaced by $T_\phi = T_{sig}/7 = 0.14*T_{sig}$ with respect to the reference signal. The numbers on the markings represent the indices of the sampled values. Counting begins with the first zero crossing of the reference signal. In order to determine the phase shift, the indices of the M sampled values which directly follow a positive zero crossing are used. These indices are designated $Idx(i_+)$.

The phase shift $T_\phi/T_{sig}$ is obtained in the form of a time normalized to the signal frequency by the sum being formed via the above-described M indices, the result being divided by the number N of sampled values and a constant being subtracted. The corresponding formula is $$\frac{T_\phi}{T_{sig}} = \frac{1}{N}\left(\sum_{i=0}^{M-1} Idx(i_+) - \frac{NM - N + M}{2} \pm \frac{1}{2}\right).$$

The phase shift determined from the indices of the sampled values is given in this way as:

$$\frac{T_\phi}{T_{sig}} = \frac{1}{20}(1+8+15) - \frac{20\cdot3 - 20 + 3}{2\cdot 20} \pm \frac{1}{2\cdot 20}$$

$$= \frac{24}{20} - \frac{43}{40} \pm \frac{1}{40} = \frac{5}{40} \pm \frac{1}{40}$$

If the phase shift is specified in fractions of the period $T_{sig}$, this leads to $$\frac{4}{40} \le \frac{T_\phi}{T_{sig}} \le \frac{6}{40} \quad 0.1 \le \frac{T_\phi}{T_{sig}} \le 0.15.$$

If the phase shift is specified in fractions of the sampling time $T_s$, this leads to $$0.667 \le \frac{T_\phi}{T_s} \le 1.0.$$

Figure 3:
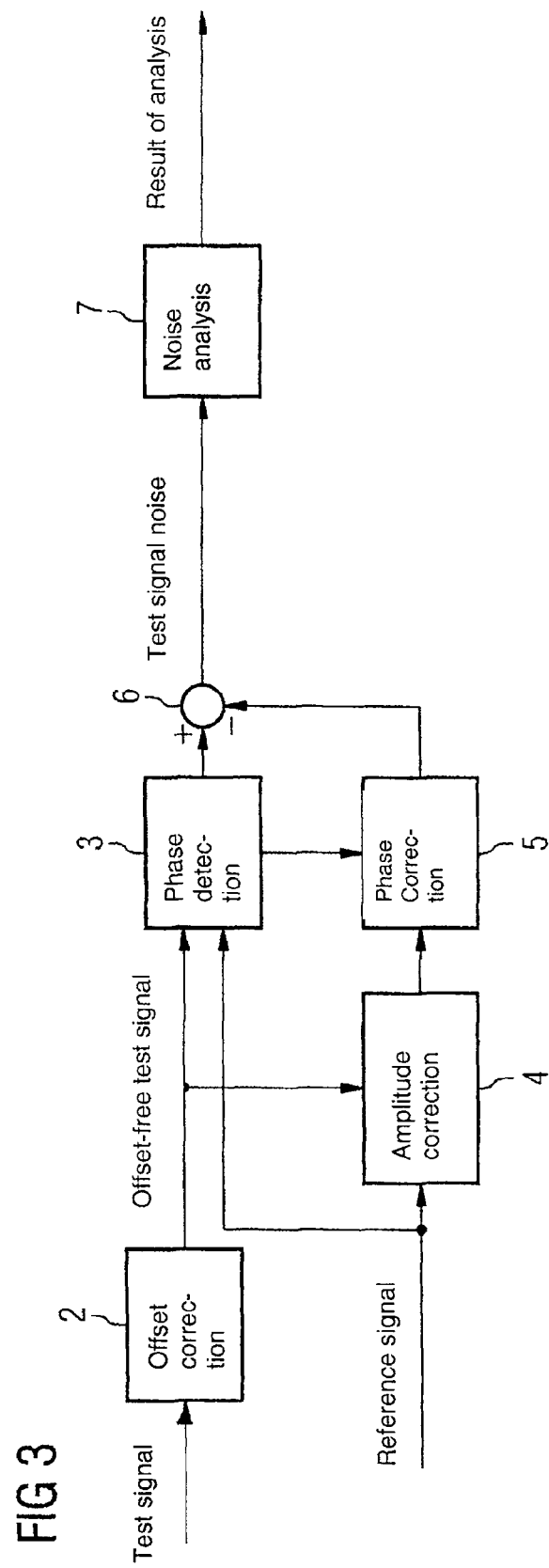
FIG. 3 shows a testing device having a measuring device.

FIG. 3 shows a testing device in which a measuring device according to the invention is used. A testing device 1 contains offset correction 2, phase detection 3, amplitude correction 4, phase correction 5, a differential element 6 and noise analysis 7.

The offset correction 2 receives a test signal, while the amplitude correction 4 receives a reference signal. The test signal and the reference signal are time-discrete signals and the test signal is a digitized analog signal. The test signal and the reference signal are both sinusoidal. The offset correction outputs an offset-free test signal to the phase detection 3 and the amplitude correction 4. In the offset correction 2, the DC component of the signal is determined and subtracted from the test signal, so that an average-free signal is produced.

The phase detection 3 also receives the reference signal 4 and contains a measuring device according to the invention for determining a relative phase shift. In this case, the phase shift between the offset-free test signal and the reference signal is determined. In the amplitude correction 4, the amplitude of the reference signal is matched to the amplitude of the test signal.

The amplitude correction 4 outputs an amplitude-corrected reference signal which, in the phase correction 5, has its phase changed on the basis of the output value from the phase detection and is output to the inverting input of the differential element 6. In the phase correction 5, the phase shift of the reference signal is matched to the phase shift of the test signal.

After the amplitudes and the phases have been matched to those of the test signal and of the reference signal, the difference between the two signals is formed in the differential element 6. The difference signal at the output from the differential element 6 then contains only the noise components of the test signal. In the noise analysis 7, the input of which is connected to the output of the differential element 6, the noise signal is analyzed and the result of the analysis is output.

The accuracy of the noise analysis depends substantially on the quality of the noise signal. If the phase shift between the two signals has not been compensated for completely, the noise signal still contains components of the test signal, which results in an erroneous determination of the signal to noise ratio.

The testing device 1 determines the signal to noise ratio of the test signal. The evaluation is carried out in real time in the time domain. The advantage of this procedure consists firstly in the fact that the evaluation can be carried out extremely quickly in real time and secondly in the fact that the device can be integrated into a semiconductor module in the form of a BIST. It exhibits a very simple hardware implementation, which demands only a few resources and is thus particularly well suited to a BIST implementation.

Figure 4:
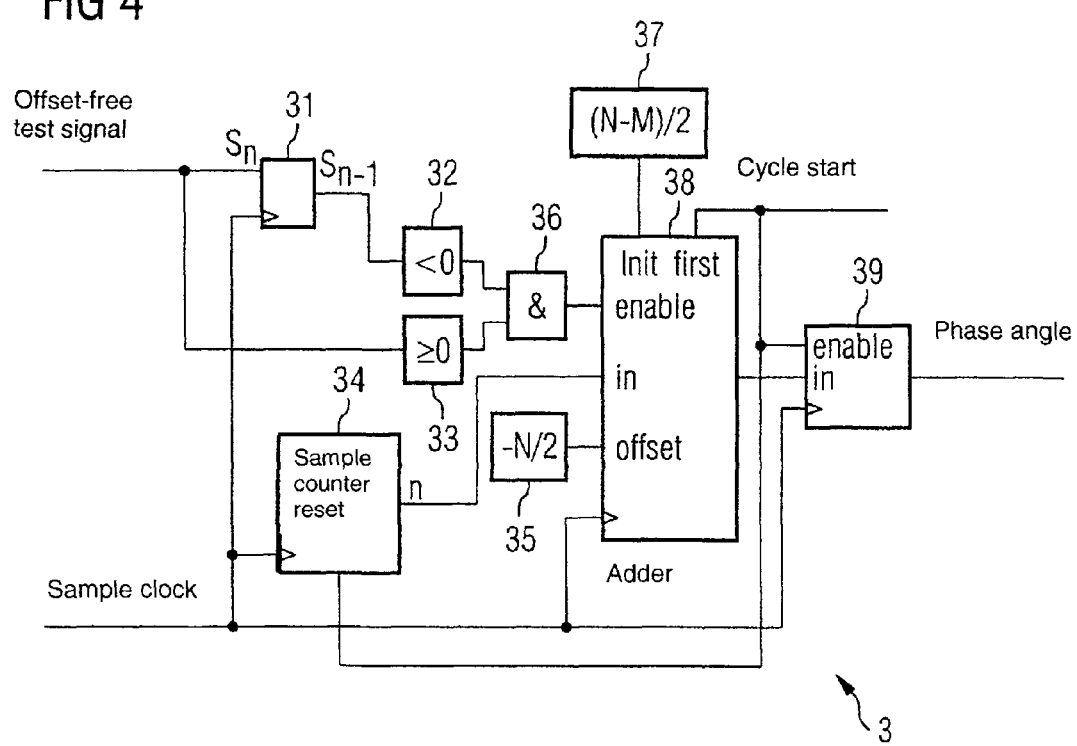
FIG. 4 shows details of the measuring device from FIG. 3.

FIG. 4 shows details of the phase detection 3 in a schematic representation. The phase detection 3 contains a delay element 31, a first comparator 32, a second comparator 33, a sample counter 34, an AND gate 36, a first store 35, a second store 37, an adder 38 and an output flip-flop 39.

The offset-free and time-discrete test signal is led to the delay element 31 and to the second comparator 33. The delay element 31 also receives a sampling clock and, at its output, outputs a delayed, offset-free test signal to the first comparator 32.

The outputs from the first comparator 32 and from the second comparator 33 are led to the inputs of the AND element 36, of which the output is connected to the enable signal of the adder 38. The sample counter 34 receives the cycle start signal on its Reset input and outputs the sampling clock at its clock input. The sample counter 34 outputs the counter reading to the In input of the adder 38. The first store 35 contains the value for −N/2 and is connected to the Offset input of the adder 38. The second store 37, on the other hand, contains the value (N−M)/2, which is connected to the Init input of the adder 38.

The adder 38 additionally receives the cycle start signal, which is generated from the reference signal by a circuit not shown here and which, in addition, is led to the First input of the adder 38 and to the Enable input of the output flip-flop 39.

The time-discrete test signal $S_n$ is fed in on the upper input path. The test signal passes through two paths. The first path leads into the delay element 31, in which the test signal $S_n$ is delayed by one sampling cycle.

After that, the delayed test signal $S_{n-1}$ is led to the first comparator 32, which checks whether the delayed test signal $S_{n-1}$ has a negative amplitude.

The second path leads directly to the second comparator 33, which checks whether the test signal has a non-negative amplitude. The results of the comparisons are fed to a logic AND element.

If both comparisons turn out to be positive, then the zero crossing of a rising flank has been detected. On the other hand, if the output from the AND element 36 is positive, then the data input of the adder 38 is activated.

The sampling clock in the lower signal path drives both the delay element 31 and a sample counter 34 as well as the adder 38. With each clock signal, the counter reading of the sample counter 34 is increased by one.

If the data input In of the adder 38 is activated by the signal on the Enable input, then the counter reading is added to the current value in the adder 38, taking the offset into account.

If the cycle start signal is activated, the current sum is output by the adder 38 to the output flip-flop 39 and the adder 38 is re-initialized with the Init value. With the cycle start, the sample counter 38 is also reset to zero. If the sampled values are distributed over M periods, then the error limit, based on the sampling rate $f_s$, is $$\pm \frac{1}{2M}.$$

The exemplary embodiment is an advantageous hardware depiction of the formula (4.6). It exhibits a very simple hardware implementation, which demands only a few resources and is thus particularly well suited to a BIST implementation. In this example, it should be emphasized in particular that neither multipliers nor dividers are needed for the implementation.

By means of the transformations according to formulas 4.1 to 4.5, further advantageous hardware implementations can be obtained.

In summary, it is possible to state that a method and an algorithm are described which make it possible to use a periodic digitized analog signal, such as a sinusoidal signal, to determine the phase shift with respect to a reference signal in the time domain in real time with the maximum time resolution.

LIST OF DESIGNATIONS

1 Testing device
2 Offset correction
3 Phase selection
4 Amplitude correction
5 Phase correction
6 Differential element
7 Noise analysis
31 Delay element
32 First comparator
33 Second comparator
34 Sample counter
35 First store
36 AND gate
37 Second store
38 Adder
39 Output flip-flop

What is claimed is:

1. A method for measuring a relative phase shift between a periodic digital test signal and a periodic digital reference signal, the method comprising:
receiving at a sampling unit M periods of the test signal and M periods of the reference signal, each of the M periods of both the test signal and the reference signal having a period length $T_{sig}$, M being a natural number greater than 1;
sampling, by the sampling unit, the test signal to generate N sampled values at a sampling frequency $f_s=1/T_s$, whereby $T_s$, is a period such that $T_s=(M*T_{sig})/N$, N being a natural number greater than M;
assigning each of the sampled values a different index value n, for which $0 \leq n \leq N-1$;
calculating, by a calculation unit, a relative phase shift $T_\phi$ between the test signal and the reference signal based on a value $$\sum_{i=0}^{M-1} Idx(i) + K,$$

K being a constant, i being a natural number, and Idx(i) corresponding to the index value n of the sampled values that are either (1) a first sampled value immediately after a zero crossing of the test signal during an $i^{th}$ period of the reference signal or (2) a last sampled value immediately before a zero crossing of the test signal.

2. The method according to claim 1, in which M and N are coprime with respect to each other.

3. The method according to claim 1, wherein at least one of the formulas is true:

$$\frac{T_\varphi}{T_{sig}} = \frac{1}{N}\left(\sum_{i=0}^{M-1} Idx(i_+) - \frac{NM - N + M}{2} \pm \frac{1}{2}\right),$$

$$\frac{T_\varphi}{T_{sig}} = \frac{1}{N}\left(\left(\sum_{i=0}^{M-1} Idx\left(i_+ - \frac{N}{2}\right)\right) + \frac{N-M}{2} \pm \frac{1}{2}\right),$$

$$\frac{T_\varphi}{T_s} = \frac{1}{N}\left(\sum_{i=0}^{M-1} Idx(i_+) - \frac{NM - N + M}{2} \pm \frac{1}{2}\right),$$

$$\frac{T_\varphi}{T_s} = \frac{1}{N}\left(\left(\sum_{i=0}^{M-1} Idx\left(i_+ - \frac{N}{2}\right)\right) + \frac{N-M}{2} \pm \frac{1}{2}\right),$$

$$\frac{T_\varphi}{T_{vs}} = \frac{1}{N}\left(\sum_{i=0}^{M-1} Idx(i_+) - \frac{NM - N + M}{2} \pm \frac{1}{2}\right),$$

$$\frac{T_\varphi}{T_{vs}} = \frac{1}{N}\left(\left(\sum_{i=0}^{M-1} Idx\left(i_+ - \frac{N}{2}\right)\right) + \frac{N-M}{2} \pm \frac{1}{2}\right)$$

where $T_{vs}$, is a period such that $T_{vs}=T_s/M$ and $Idx(i_+)$ corresponds to the index values n of the sampled values which are the first sampled value after a positive zero crossing of the test signal during the $i^{th}$ period of the reference signal.

4. The method according to claim 1, in which the index value n is set to zero at the time of the zero crossing of the reference signal during one of the periods of the reference signal in which i=0.

5. The method according to claim 1, in which the test signal and the reference signal are each a sinusoidal signal.

6. The method according to claim 1, in which, following the calculation of the relative phase shift $T_\phi$, the phase of the test signal is changed and the relative phase shift $T_\phi$ of test signal and reference signal is then measured again.

7. The method according to claim 1, in which the received test signal is a digitized analog signal.

8. The method of claim 1, wherein the zero crossings are only rising zero crossings and not falling zero crossings.

9. The method of claim 1, wherein the zero crossings are only falling zero crossings and not rising zero crossings.

10. A measuring device for measuring the relative phase shift between a periodic digital test signal and a periodic digital reference signal, the measuring device comprising:
an input connection configured to receive a test signal;
an input connection configured to receive a reference signal;
a sampling unit configured to sample M periods of the test signal so as to generate N sampled values at a sampling frequency $f_s=1/T_s$, where $T_s$ is a period such that $T_s=(M*T_{sig})/N$ and $T_{sig}$ is a period length of the test signal and a period length of the reference signal, M being a natural number greater than 1 and N being a natural number greater than M, wherein the sampling unit comprises a counter configured to indicate a different index number n to each of the sampled values, where $0 < n < N-1$, the sampled values being synchronized with respect to the reference signal;
a calculation unit configured to determine a relative phase shift $T_\phi$ between the test signal and the reference signal based on a value $$\sum_{i=0}^{M-1} Idx(i) + K,$$

where K is a constant, i is a natural number, and Idx(i) corresponds either to the value of the index number n indicated by the counter at the time of the first sampled value immediately after a zero crossing of the test signal during the $i^{th}$ period of the reference signal or the value of the index number n indicated by the counter at the time of the last sampled value immediately before a zero crossing of the test signal during the $i^{th}$ period of the reference signal.

11. The measuring device according to claim 10, in which $T_\varphi$ is calculated by means of one of the formulas $$\frac{T_\varphi}{T_{sig}} = \frac{1}{N}\left(\sum_{i=0}^{M-1} Idx(i_+) - \frac{NM-N+M}{2} \pm \frac{1}{2}\right),$$

$$\frac{T_\varphi}{T_{sig}} = \frac{1}{N}\left(\left(\sum_{i=0}^{M-1} Idx\left(i_+ - \frac{N}{2}\right)\right) + \frac{N-M}{2} \pm \frac{1}{2}\right)$$

$$\frac{T_\varphi}{T_s} = \frac{1}{N}\left(\sum_{i=0}^{M-1} Idx(i_+) - \frac{NM-N+M}{2} \pm \frac{1}{2}\right),$$

$$\frac{T_\varphi}{T_s} = \frac{1}{N}\left(\left(\sum_{i=0}^{M-1} Idx\left(i_+ - \frac{N}{2}\right)\right) + \frac{N-M}{2} \pm \frac{1}{2}\right),$$

$$\frac{T_\varphi}{T_{vs}} = \frac{1}{N}\left(\sum_{i=0}^{M-1} Idx(i_+) - \frac{NM-N+M}{2} \pm \frac{1}{2}\right),$$

$$\frac{T_\varphi}{T_{vs}} = \frac{1}{N}\left(\left(\sum_{i=0}^{M-1} Idx\left(i_+ - \frac{N}{2}\right)\right) + \frac{N-M}{2} \pm \frac{1}{2}\right),$$

where $T_{vs}=T_{s/M\ and\ Idx(i+)}$ corresponds to the number n at the time at which the first sampling is carried out after a positive zero crossing of the test signal during the $i^{th}$ period of the reference signal.

12. The measuring device according to claim 10, in which M and N are coprime.

13. The measuring device according to claim 10, in which the counter reading of the counter is set to zero at the time of the zero crossing of the reference signal during one of the periods of the reference signal in which i=0.

14. The measuring device according to claim 10, the measuring device being constructed as part of a built in self test (BIST).

15. The measuring device according to claim 10, which is constructed as part of a phase correction circuit.

16. The measuring device of claim 10, wherein the zero crossings are only rising zero crossings and not falling zero crossings.

17. The measuring device of claim 10, wherein the zero crossings are only falling zero crossings and not rising zero crossings.

18. A measuring device comprising:
an input connection configured to receive a test signal;
an input connection configured to receive a reference signal;
a sampling unit configured to sample M periods of the test signal so as to generate N sampled values at a sampling frequency $f_s=1\ T_s$, where $T_s$ is a period such that $T_s=(M*T_{sig})/N$ and $T_{sig}$ is a period length of the test signal and a period length of the reference signal, M being a natural number greater than 1 and N being a natural number greater than M, wherein the sampling unit comprises a counter configured to indicate a different index number n of each of the sampled values, where 0<n<N−1, the sampled values being synchronized with respect to the reference signal;
a calculation unit configured to determine a relative phase shift $T_\varphi$ between the test signal and the reference signal based on a value $$\sum_{i=0}^{M-1} Idx(i) + K,$$

where K is a constant, i is a natural number, and Idx(i) corresponds either to a value of index number n indicated by the counter at the time of the first sampled value immediately after a zero crossing of the test signal during the $i^{th}$ period of the reference signal or a value of index number n indicated by the counter at the time of the last sampled value immediately before a zero crossing of the test signal during the $i^{th}$ period of the reference signal.

19. The measuring device according to claim 18, at least one of the formulas is true:

$$\frac{T_\varphi}{T_{sig}} = \frac{1}{N}\left(\sum_{i=0}^{M-1} Idx(i_+) - \frac{NM-N+M}{2} \pm \frac{1}{2}\right),$$

$$\frac{T_\varphi}{T_{sig}} = \frac{1}{N}\left(\left(\sum_{i=0}^{M-1} Idx\left(i_+ - \frac{N}{2}\right)\right) + \frac{N-M}{2} \pm \frac{1}{2}\right)$$

$$\frac{T_\varphi}{T_s} = \frac{1}{N}\left(\sum_{i=0}^{M-1} Idx(i_+) - \frac{NM-N+M}{2} \pm \frac{1}{2}\right),$$

$$\frac{T_\varphi}{T_s} = \frac{1}{N}\left(\left(\sum_{i=0}^{M-1} Idx\left(i_+ - \frac{N}{2}\right)\right) + \frac{N-M}{2} \pm \frac{1}{2}\right),$$

$$\frac{T_\varphi}{T_{vs}} = \frac{1}{N}\left(\sum_{i=0}^{M-1} Idx(i_+) - \frac{NM-N+M}{2} \pm \frac{1}{2}\right),$$

$$\frac{T_\varphi}{T_{vs}} = \frac{1}{N}\left(\left(\sum_{i=0}^{M-1} Idx\left(i_+ - \frac{N}{2}\right)\right) + \frac{N-M}{2} \pm \frac{1}{2}\right),$$

where $T_{vs}=T_s/M$ and $Idx(i_+)$ corresponds to the index number n at the time at which the first sampling is carried out after a positive zero crossing of the test signal during the $i^{th}$ period of the reference signal.

20. The measuring device according to claim 18, in which M and N are coprime with respect to each other.

21. The measuring device according to claim 18, in which the value of index number n, as indicated by the counter, is set to zero at the time of the zero crossing of the reference signal of one of the periods of the reference signal in which i=0.

22. The measuring device according to claim 18, wherein the measuring device is part of a built in self test (BIST).

23. The measuring device according to claim 18, wherein the measuring device is part of a phase correction circuit.

24. The measuring device of claim 18, wherein the zero crossings are only rising zero crossings and not falling zero crossings.

25. The measuring device of claim 18, wherein the zero crossings are only falling zero crossings and not rising zero crossings.

* * * * *

UNITED STATES PATENT AND TRADEMARK OFFICE
CERTIFICATE OF CORRECTION

PATENT NO. : 7,945,406 B2
APPLICATION NO. : 11/530257
DATED : May 17, 2011
INVENTOR(S) : Stephane Kirmser et al.

It is certified that error appears in the above-identified patent and that said Letters Patent is hereby corrected as shown below:

Column 13, Claim 1, Line 45:
Please delete "," after $T_s$

Column 14, Claim 3, Line 20:
Please delete "," after $T_{vs}$

Column 15, Claim 11, Line 19:
Please insert -- , -- after the second listed equation Column 15, Claim 11, Line 33:
Please delete "$T_{s/M \text{ and } Idx(i+)}$" and insert -- $T_s/M$ and $Idx(i+)$ --

Column 15, Claim 18, Line 60:
Please insert -- / -- after 1

Signed and Sealed this
Twenty-sixth Day of June, 2012

David J. Kappos
*Director of the United States Patent and Trademark Office*